(12) United States Patent
Wang et al.

(10) Patent No.: US 6,805,600 B2
(45) Date of Patent: Oct. 19, 2004

(54) METHOD OF MANUFACTURING WHITE LIGHT SOURCE

(75) Inventors: Chien-Yuan Wang, Kaohsiung Hsien (TW); Ru-Shi Liu, Hsinchu Hsien (TW); Yi-Shan Lin, Nan Tou Hsien (TW); Chia-Cheng Kang, Taipei (TW); Liang-Sheng Chi, Yun-Lin Hsien (TW); Hung-Yuan Su, Taipei Hsien (TW); Hsing Chen Chen-Lun, Taipei Hsien (TW)

(73) Assignee: Lite-On Technology Corporation, Taipei (TW)

( * ) Notice: Subject to any disclaimer, the term of this patent is extended or adjusted under 35 U.S.C. 154(b) by 191 days.

(21) Appl. No.: 09/983,138

(22) Filed: Oct. 23, 2001

(65) Prior Publication Data

US 2003/0075705 A1 Apr. 24, 2003

(51) Int. Cl.$^7$ .............................. H01J 9/00; H05B 33/10
(52) U.S. Cl. ........................... 445/24; 445/25; 313/503; 313/502
(58) Field of Search ................................. 313/502, 503, 313/506; 445/24

(56) References Cited

U.S. PATENT DOCUMENTS

| | | | | |
|---|---|---|---|---|
| 4,032,812 A | * | 6/1977 | Kobayashi et al. | 313/487 |
| 4,079,287 A | * | 3/1978 | Soules et al. | 313/487 |
| 6,137,217 A | * | 10/2000 | Pappalardo et al. | 313/487 |
| 6,366,033 B1 | * | 4/2002 | Greci et al. | 315/363 |
| 6,717,349 B2 | * | 4/2004 | Wang et al. | 313/483 |

* cited by examiner

Primary Examiner—Nimeshkumar D. Patel
Assistant Examiner—Mariceli Santiago
(74) Attorney, Agent, or Firm—Rosenberg, Klein & Lee

(57) ABSTRACT

A method for manufacturing white light source includes the steps of providing an ultra-violet light as radiation source; and preparing two kinds of phosphors each receiving the ultra-violet light and emitting light of different wavelength. One phosphor is designated to emit light covering two wavelength regimes of three primitive colors, i.e., red light (585–640 nm), green light (500–570 nm) and blue light (430–490 nm), and another phosphor is designated to emit light covering remaining wavelength regime of the three primitive colors. The phosphors are mixed in predetermined ratio such that the lights of different wavelength are combined to provide a white light.

7 Claims, 8 Drawing Sheets

METHOD OF MANUFACTURING WHITE LIGHT SOURCE

FIELD OF THE INVENTION

The present invention relates to a method for manufacturing white light source, especially to a method for manufacturing high-brightness white light source by ultraviolet light source and suitable phosphor.

BACKGROUND OF THE INVENTION

A white light source is generally provided by mixing light source of different wavelength. For example, a conventional white light source can be realized by mixing red light, green light and blue light with suitable intensity ratio. Alternatively, the white light source can be realized by mixing yellow light and blue light with suitable intensity ratio. The conventional method for manufacturing white light source can be summarized as following:

In a first prior art of white light source, three LED dies based on InGaAlP, GaN and GaP are packaged into a lamp and emit red light, blue light and green light, respectively. The light emitted from the lamp can be mixed by a lens to provide white light.

In a second prior art of white light source, two LED dies based on GaN and GaP are functioned to emit blue light and yellowish-green light. The blue light and yellowish-green light are mixed to provide white light. The white light sources according to above-mentioned two approaches have efficiency of 20 lm/W.

A third prior art of white light source is proposed by Nichia Chemical co., wherein an InGaN based blue LED and a yellow YAG phosphor are used to provide the white light source. This white light source requires uni-color LED to provide white light at the expense of smaller efficiency 15 lm/W. Moreover, the phosphor is a mature art and commercially available.

A fourth prior art of white light source is proposed by Sumitomo Electric Industries Ltd., and uses a white-light LED based on ZnSe. A CdZnSe thin film is formed on the surface of a ZnSe crystalline substrate. The CdZnSe thin film is functioned to emit blue light and the ZnSe crystalline substrate emits yellow light after receiving the blue light of the CdZnSe thin film. The blue light and the yellow light are mixed to provide white light. In this approach, only one LED chip is required and the operation voltage thereof is 2.7 V, smaller than the 3.5 V operation voltage of the GaN based LED. Moreover, no phosphor is required.

In a fifth approach to provide white light source, an ultra-violet LED is used to excite a plurality of phosphors such that the phosphors luminesce light of different colors for mixing into a white light.

In first and second prior art white light source, LEDs for multiple colors are required. The color of the white light source is distorted if one of the LEDs malfunctions. Moreover, the driving voltages for LEDs of different colors are also different; this complicates the design of driving circuit.

The third prior art white light source employs complementary color to achieve white light. However, the white light produced in this way has no uniform spectral distribution (especially in 400 nm–700 nm) as the natural white light such as sunlight. The white light thus produced has relatively poor chroma, which is, even indistinguishable to human eyes, differentiable to instrument such as camera. Therefore, the color rendering property and reproducing ability are not satisfactory and this white light source is used mainly for lighting.

The fourth prior art white light source has the drawbacks of low luminescent efficiency (only 8 lm/W) and short lifetime about 8000 hours.

In fifth prior art white light source, it is preferable to use three phosphors for emitting three different colors to enhance color rendering property. However, the phosphors should be prudently chosen to have absorption band matched with the wavelength of the exciting radiation. Moreover, the phosphors should have compatible absorption coefficients and quantum efficiency to provide white light of high quality. Those requirements place a strict constrain to the materials of the phosphors.

SUMMARY OF THE INVENTION

It is the object of the present invention to provide a method for manufacturing high-brightness white light source by ultraviolet light source and suitable phosphor. The emission spectrums of the phosphors after being excited by the ultra-violet radiation source should cover the wavelength regimes of red light (585–640 nm), green light (500–570 nm) and blue light (430–490 nm).

In one aspect of the present invention, the method for manufacturing white light source includes the steps of providing an ultra-violet light as radiation source; and preparing two kinds of phosphors each receiving the ultra-violet light and emitting light of different wavelength.

In another aspect of the present invention, one phosphor is designated to emit light covering two wavelength regimes of three primitive colors, and another phosphor is designated to emit light covering remaining wavelength regime of the three primitive colors. The phosphors are mixed in predetermined ratio such that the lights of different wavelength are combined to provide a white light.

The various objects and advantages of the present invention will be more readily understood from the following detailed description when read in conjunction with the appended drawing, in which:

DETAILED DESCRIPTION OF THE INVENTION

Figure 1:
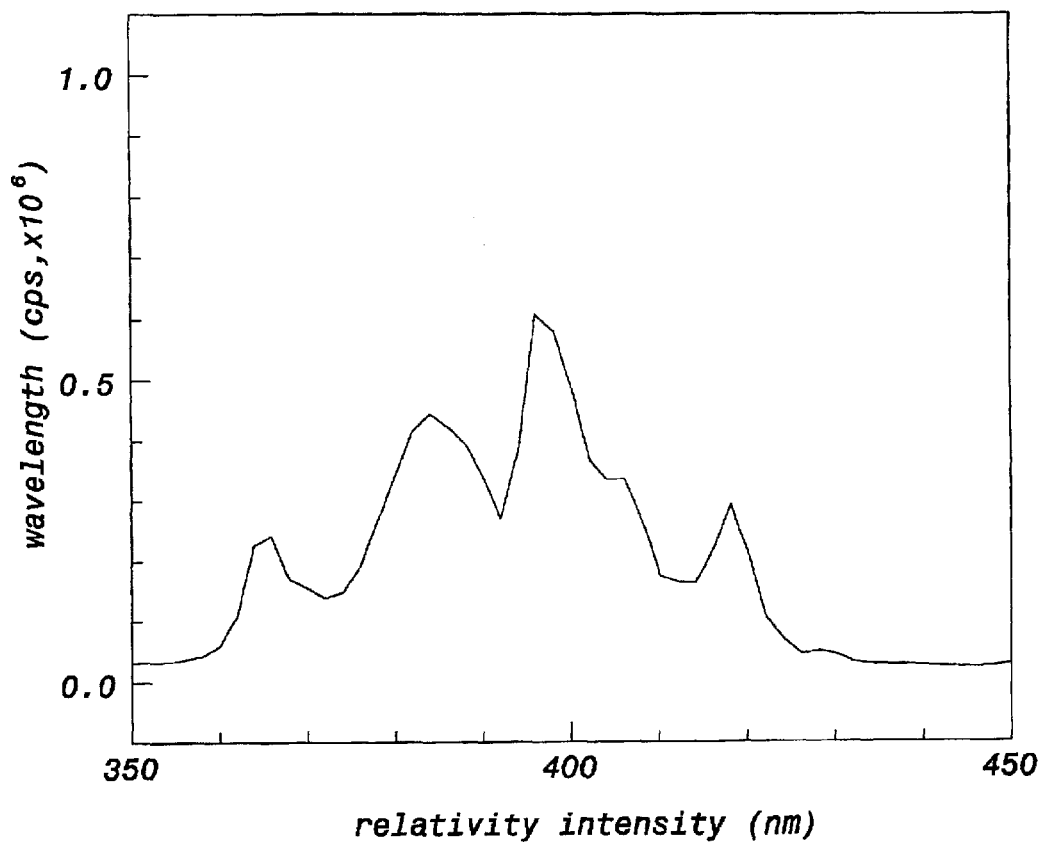
FIG. 1 shows the spectrum of the $(Y_{1.9}Eu_{0.1})O_3$ phosphor powder with reference to wavelength 610 nm.

The present invention is intended to provide a white light source with an ultra-violet light as radiation source and two kinds of phosphors as wavelength conversion medium. The emission spectrums of the phosphors after being excited by the ultra-violet radiation source should cover the wavelength regimes of red light (585–640 nm), green light (500–570 nm) and blue light (430–490 nm). More particularly, one of the two phosphors is designated to emit light covering two wavelength regimes of the three primitive colors and another one of the two phosphors is designated to emit light covering remaining wavelength regime of the three primitive colors. By suitably adjusting the mixing ratio of the two phosphors, white light with high quality can be obtained.

In the present invention, a phosphor simultaneously emitting two wavelength regimes of the three primitive colors is provided. The phosphor can be prepared by adding or doping foreign ions with relatively less amount in a host material. For example, $Eu^{3+}$ can be added into $Y_2O_3$ host to provide a phosphor. A foreign ion is referred to an activator as it can absorb a radiating photon and re-emit another photon. Sometimes, the activator cannot directly absorb a radiated photon, in which case a sensitisor is added. The sensitisor absorbs the radiating photon and passes the energy to the activator. If two different ions are added in a host material and functioned as activators, a phosphor emitting light of different color can be achieved. However, different activators may require radiating photon of different wavelength. Therefore, the above approach is not practical. In the present invention, both activator and sensitisor are incorporated in the host material to facilitate the emission of light with different color. For example, if $BaMgAl_{10}O_{17}$ is used as host crystal, $Eu^{2+}$ ions are incorporated in the host crystal to emit blue light upon absorbing an ultraviolet exciting radiation. Moreover, $Mn^{2+}$ ions are also incorporated in the host crystal to and the $Mn^{2+}$ ions can emit green light upon receiving the blue light emitted from the $Eu^{2+}$ ions. Therefore, blue green light mixed by blue light and green light can be provided by using exciting radiation of uni-color.

In the present invention, the source of the exciting radiation can be one of the LED, electronic beam and plasma. The phosphor material for emitting light of two colors is $(Ba_{1-x}Eu_x)(Mg_{1-y}Mn_y) Al_{10}O_{17}$, wherein $0<x\leq0.5$, $0<y\leq0.5$; alternatively is $(Ba_{1-x}Eu_x)(Mg_{2-y}Mn_y) Al_{16}O_{27}$, wherein $0<x\leq0.5$, $0<y\leq0.5$; for emitting blue green light.

Moreover, another phosphor material for emitting light of two colors is $(Y_{2-x}Eu_x)O_3$, wherein $0<x\leq0.5$, or $(Y_{2-x}Eu_x)O_2S$, wherein $0<x\leq0.5$, or $(Y_{2-x}Eu_x)Al_5O_{12}$, wherein $0<x\leq0.5$, for emitting red light or orange red light.

Hereinafter several preferred embodiments of the present invention for providing white light source are demonstrated.

EXAMPLE 1
White Light Source of High Color Temperature

1. Synthesizing a phosphor powder with formula $Y_2O_3$:Eu such as $(Y_{1.9}Eu_{0.1})O_3$ by solid-state reaction or chemosynthesis method such as citrate sol gel or co-precipitation.

2. Synthesizing a phosphor powder with formula $BaMgAl_{10}O_{17}$: Eu, Mn such as $(Ba_{0.9}Eu_{0.1})(Mg_{0.96}Mn_{0.04}) Al_{10}O_{17}$ by solid-state reaction or chemosynthesis method such as citrate sol gel or co-precipitation.

3. Measuring the spectrum of the $(Y_{1.9}Eu_{0.1})O_3$ phosphor powder with reference to wavelength 610 nm. As shown in FIG. 1, the $(Y_{1.9}Eu_{0.1})O_3$ phosphor powder can be excited by an ultraviolet light.

Figure 2:
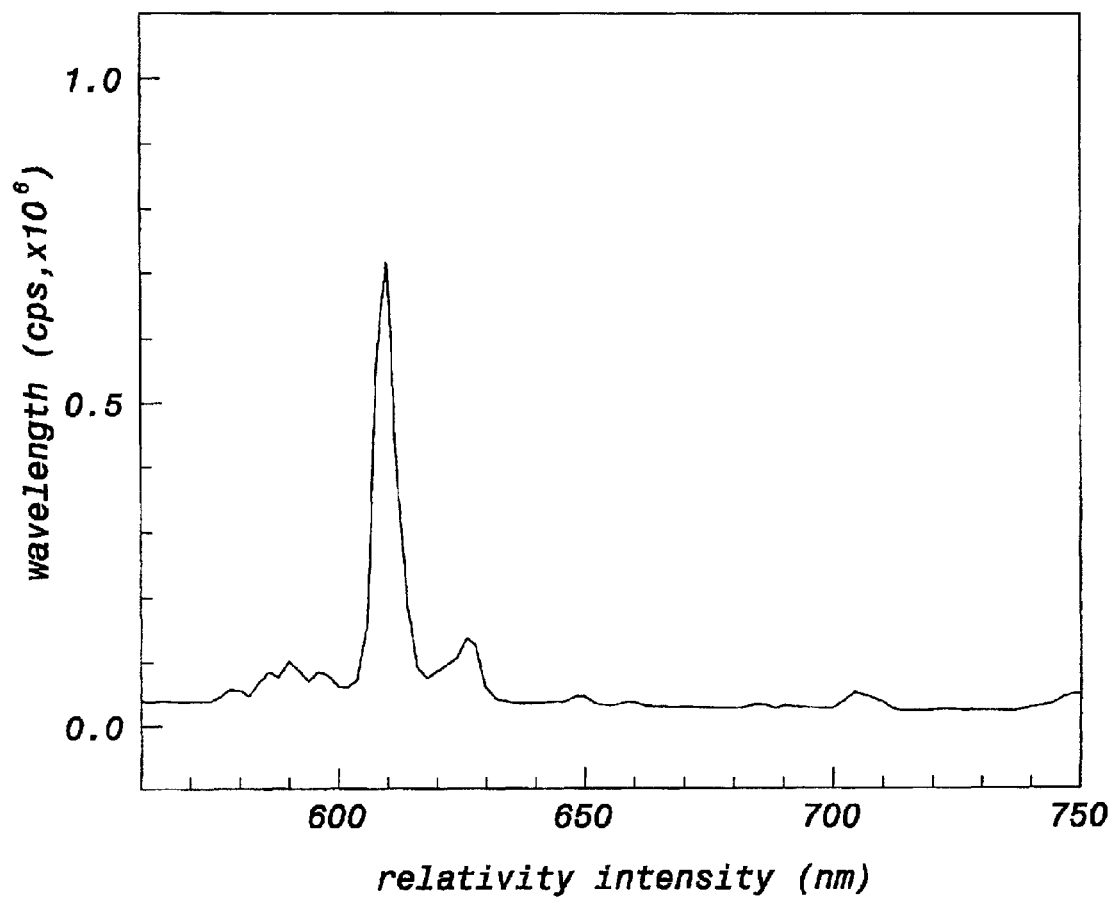
FIG. 2 shows the emission spectrum of the $(Y_{1.9}Eu_{0.1})O_3$ phosphor powder excited by a 396 nm ultraviolet light.
Figure 3:
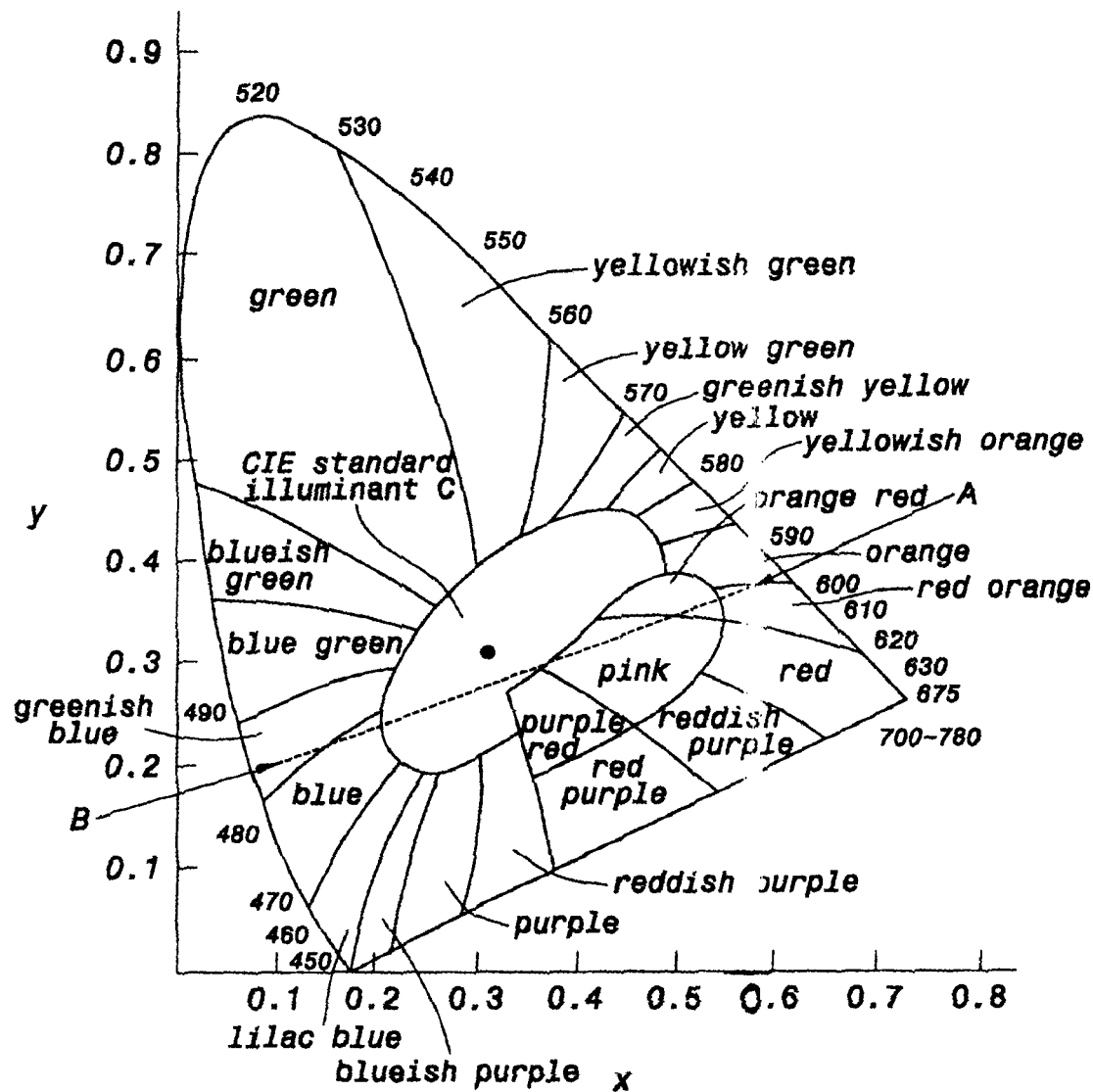
FIG. 3 shows that a dashed straight line connecting points A and B passes a white light region with high color temperature in the CIE chromaticity diagram.

4. Measuring the emission spectrum of the $(Y_{1.9}Eu_{0.1})O_3$ phosphor powder excited by a 396 nm ultraviolet light. As shown in FIG. 2, the $(Y_{1.9}Eu_{0.1})O_3$ phosphor powder emits a red light after being excited by a 396 nm ultraviolet light. The color coordinate of the red light is determined with reference to 1931 CIE (commission internationale del'Eclairage) chromaticity diagram and is marked by letter "A" in FIG. 3.

Figure 4:
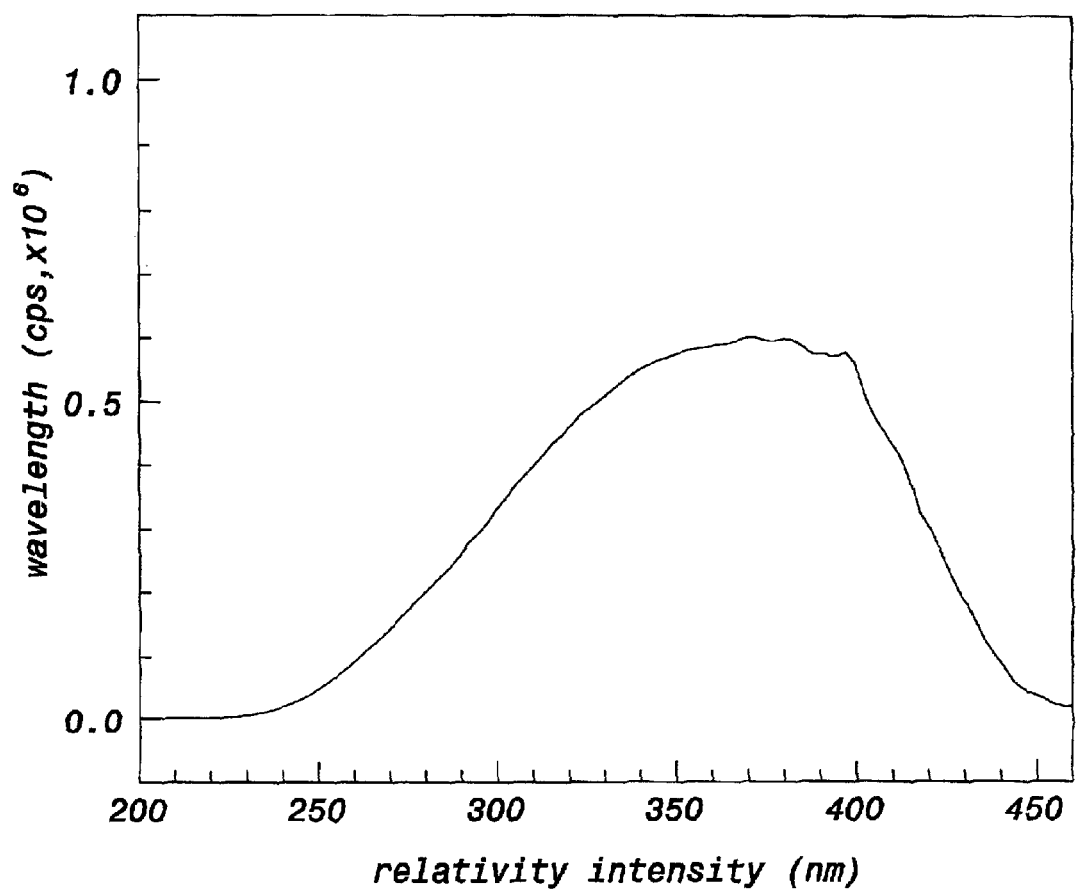
FIG. 4 shows the spectrum of the $(Ba_{0.9}Eu_{0.1})(Mg_{0.96}Mn_{0.04})Al_{10}O_{17}$ phosphor powder with reference to wavelength 488 nm.

5. Measuring the spectrum of the $(Ba_{0.9}Eu_{0.1})(Mg_{0.96}Mn_{0.04}) Al_{10}O_{17}$ phosphor powder with reference to wavelength 488 nm. As shown in FIG. 4, the $(Ba_{0.9}Eu_{0.1})(Mg_{0.96}Mn_{0.04}) Al_{10}O_{17}$ phosphor powder can be excited by an ultraviolet light.

Figure 5:
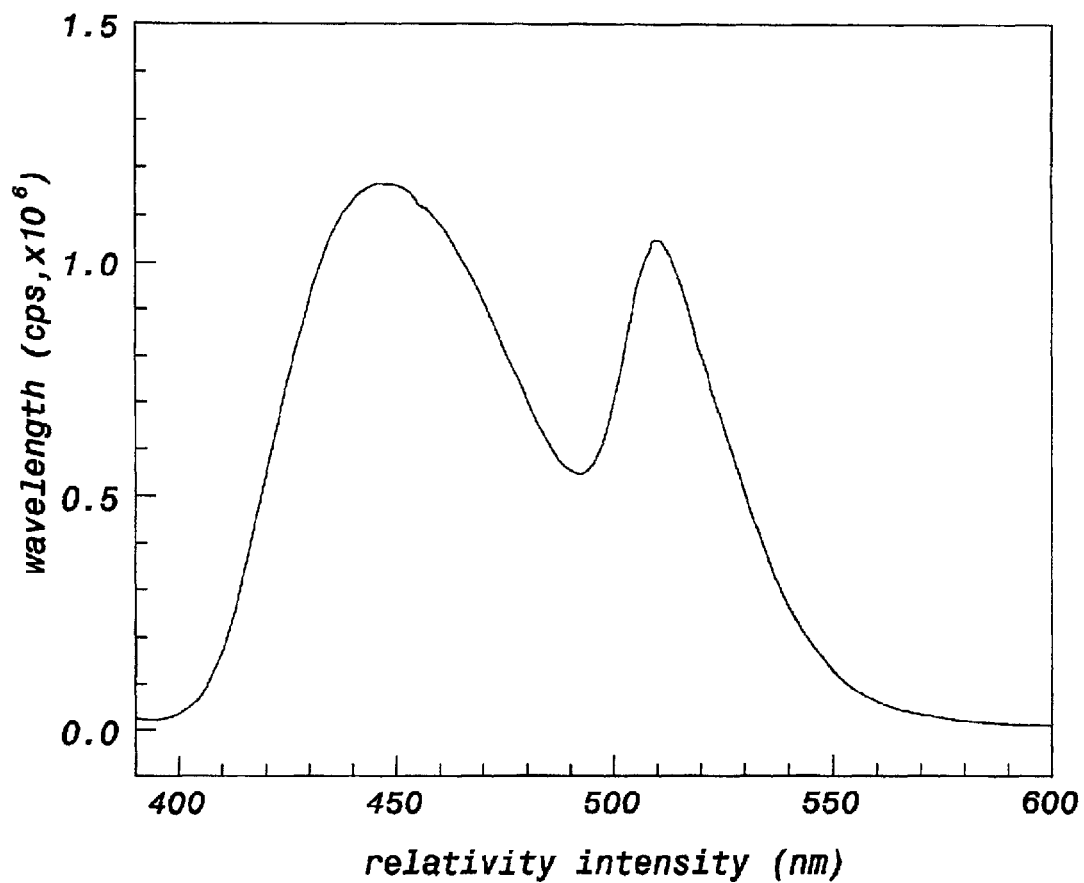
FIG. 5 shows the emission spectrum of the $(Ba_{0.9}Eu_{0.1})(Mg_{0.96}Mn_{0.04})Al_{10}O_{17}$ phosphor powder excited by a 396 nm ultraviolet light.

6. Measuring the emission spectrum of the $(Ba_{0.9}Eu_{0.1})(Mg_{0.96}Mn_{0.04}) Al_{10}O_{17}$ phosphor powder excited by a 396 nm ultraviolet light. As shown in FIG. 5, the $(Ba_{0.9}Eu_{0.1})(Mg_{0.96}Mn_{0.04}) Al_{10}O_{17}$ phosphor powder emits a green light and a blue light after being excited by a 396 nm ultraviolet light. The color coordinate of the blue green light (mixture of the green light and the blue light) is determined with reference to 1931 CIE chromaticity diagram and is marked by letter "B" in FIG. 3.

7. Drawing a dashed straight line connecting points A and B in FIG. 3. As can be seen from FIG. 3, the dashed straight line passes a white light region in the CIE chromaticity diagram. In other word, the light (red light) with color coordinate A and the light (blue green light) with color coordinate B are mixed to provide a white light for human eyes. Moreover, the white light has higher high color temperature because the color coordinate B is near the regime of blue light.

Therefore, the above-mentioned two phosphor powders are mixed in suitable ration and packaged with a 396 nm ultraviolet LED to serve as a white light LED. The package of the white light LED can be implemented in one of the forms including lamp, SMD (surface mount device) and COB (chip on board).

EXAMPLE 2
White Light Source of Low Color Temperature

1. Synthesizing a phosphor powder with formula $Y_2O_3$:Eu such as $(Y_{1.9}Eu_{0.1})O_3$ by solid-state reaction or chemosynthesis method such as citrate sol gel or co-precipitation.

2. Synthesizing a phosphor powder with formula $BaMgAl_{10}O_{17}$: Eu, Mn such as $(Ba_{0.9}Eu_{0.1})(Mg_{0.93}Mn_{0.07}) Al_{10}O_{17}$ by solid-state reaction or chemosynthesis method such as citrate sol gel or co-precipitation.

3. Measuring the spectrum of the $(Y_{1.9}Eu_{0.1})O_3$ phosphor powder with reference to wavelength 610 nm. As shown in FIG. 1, the $(Y_{1.9}Eu_{0.1})O_3$ phosphor powder can be excited by an ultraviolet light.

Figure 8:
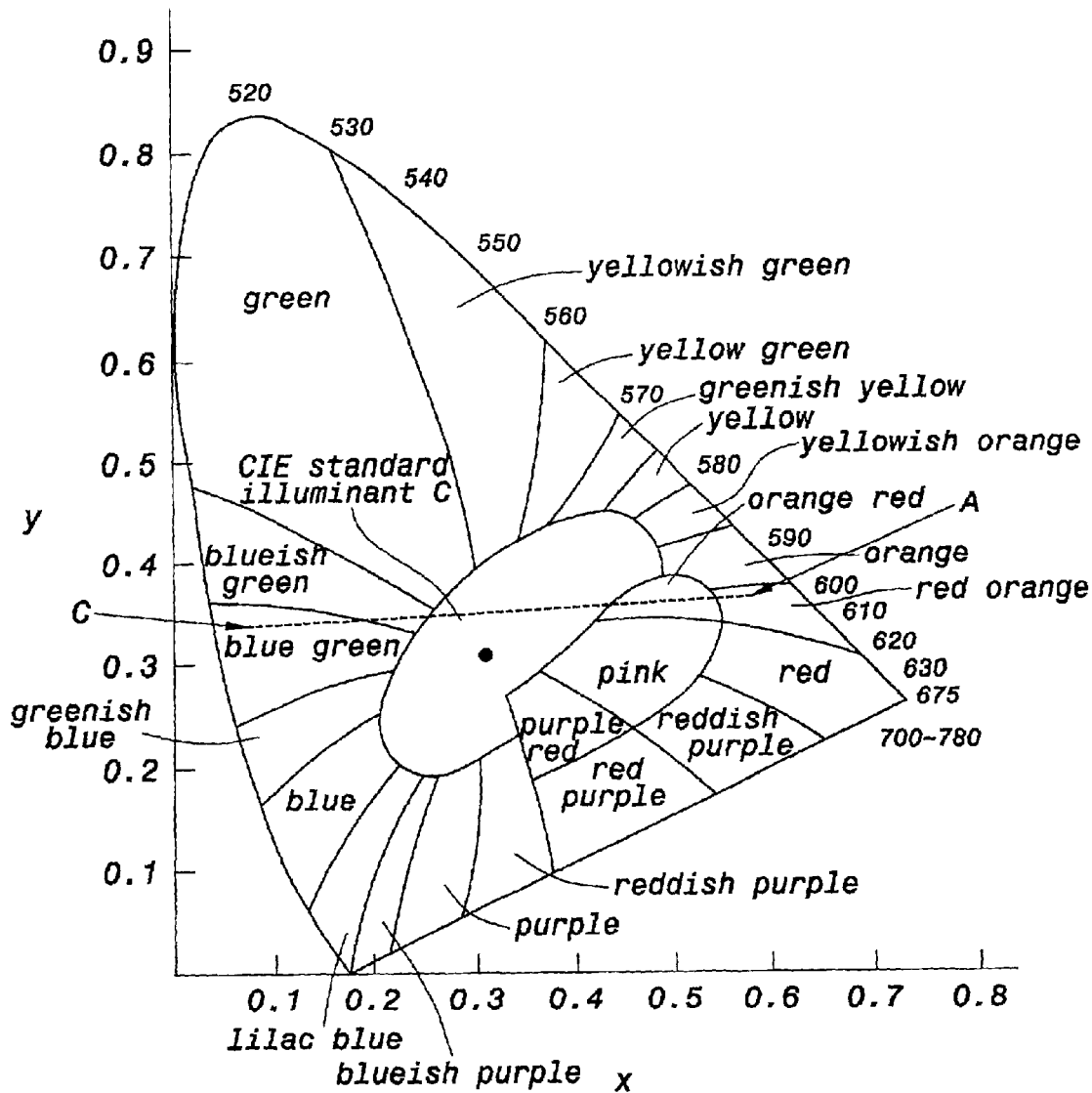
FIG. 8 shows that a dashed straight line connecting points A and C passes a white light region with low color temperature in the CIE chromaticity diagram.

4. Measuring the emission spectrum of the $(Y_{1.9}Eu_{0.1})O_3$ phosphor powder excited by a 396 nm ultraviolet light. As shown in FIG. 2, the $(Y_{1.9}Eu_{0.1})O_3$ phosphor powder emits a red light after being excited by a 396 nm ultraviolet light. The color coordinate of the red light is determined with reference to 1931 CIE chromaticity diagram and is marked by letter "A" in FIG. 8.

Figure 6:
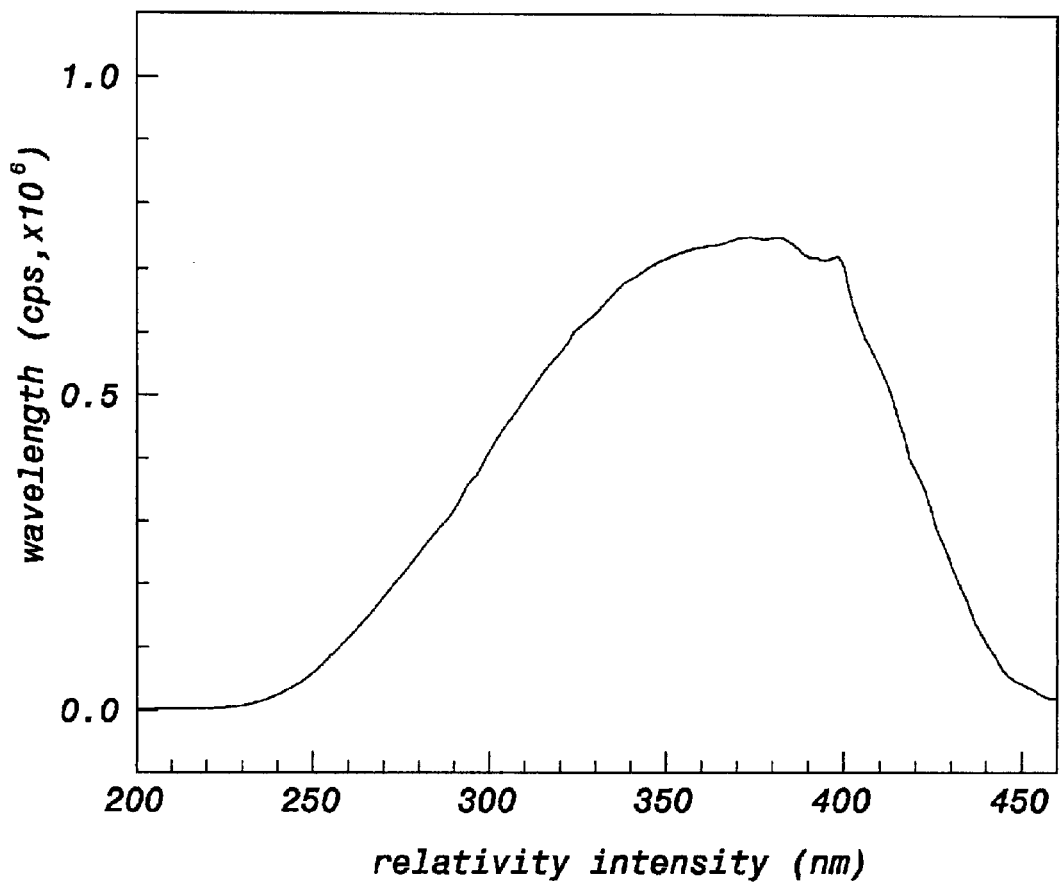
FIG. 6 shows the spectrum of the $(Ba_{0.9}Eu_{0.1})(Mg_{0.93}Mn_{0.07})Al_{10}O_{17}$ phosphor powder with reference to wavelength 488 nm.

5. Measuring the spectrum of the $(Ba_{0.9}Eu_{0.1})(Mg_{0.93}Mn_{0.07}) Al_{10}O_{17}$ phosphor powder with reference to wavelength 488 nm. As shown in FIG. 6, the $(Ba_{0.9}Eu_{0.1})(Mg_{0.93}Mn_{0.07}) Al_{10}O_{17}$ phosphor powder can be excited by an ultraviolet light.

Figure 7:
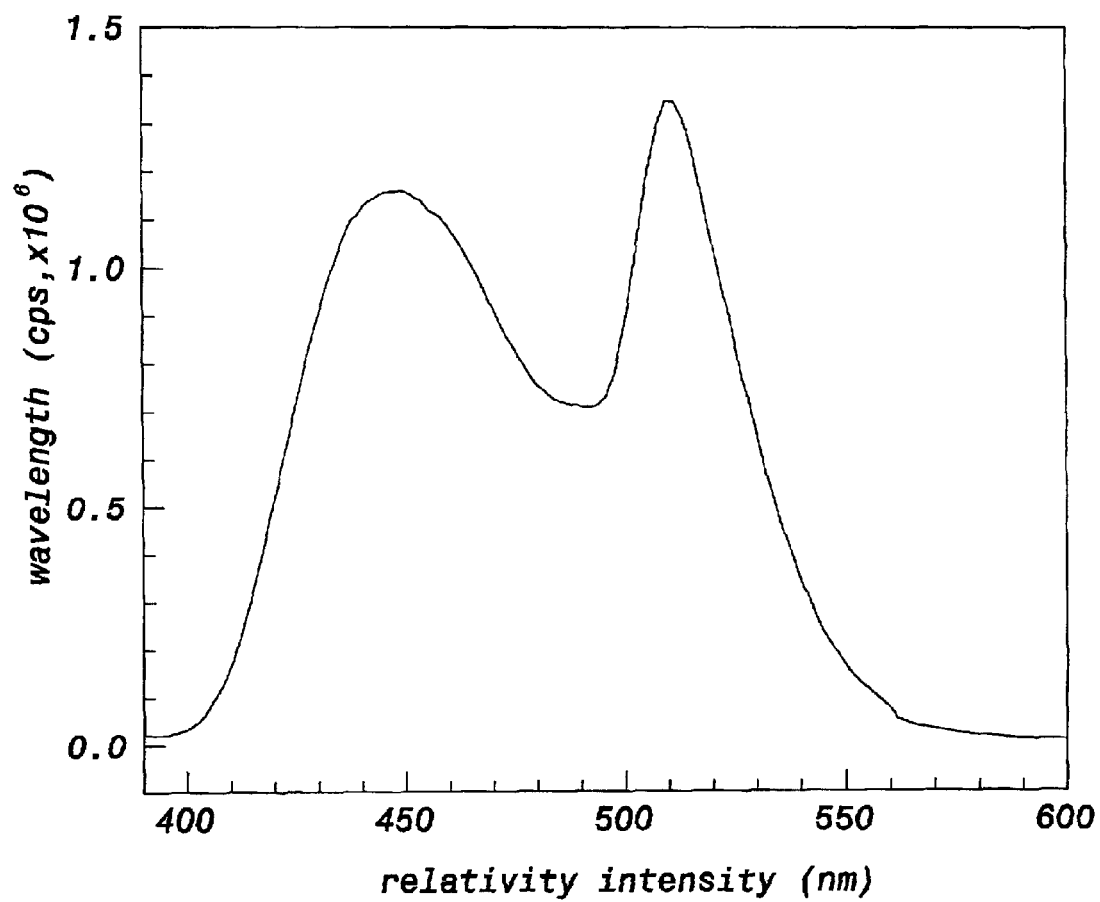
FIG. 7 shows the emission spectrum of the $(Ba_{0.9}Eu_{0.1})(Mg_{0.93}Mn_{0.07})Al_{10}O_{17}$ phosphor powder excited by a 396 nm ultraviolet light.

6. Measuring the emission spectrum of the $(Ba_{0.9}Eu_{0.1})(Mg_{0.93}Mn_{0.07}) Al_{10}O_{17}$ phosphor powder excited by a 396 nm ultraviolet light. As shown in FIG. 7, the $(Ba_{0.9}Eu_{0.1})(Mg_{0.93}Mn_{0.07}) Al_{10}O_{17}$ phosphor powder emits a green light and a blue light after being excited by a 396 nm ultraviolet light. The color coordinate of the blue green light (mixture of the green light and the blue light) is determined with reference to 1931 CIE chromaticity diagram and is marked by letter "C" in FIG. 3.

7. Drawing a dashed straight line connecting points A and C in FIG. 8. As can be seen from FIG. 8, the dashed straight line passes a white light region in the CIE chromaticity diagram. In other word, the light (red light) with color coordinate A and the light (blue green light) with color coordinate C are mixed to provide a white light for human eyes. Moreover, the white light has lower high color temperature because the color coordinate B is near the regime of green light.

Therefore, the above-mentioned two phosphor powders are mixed in suitable ration and packaged with a 396 nm ultraviolet LED to serve as a white light LED. The package of the white light LED can be implemented in one of the forms including lamp, SMD (surface mount device) and COB (chip on board).

To sum up, the white light source provided by the present invention has peculiar advantages over prior art white light source in following aspects:

1. The present invention employs only two kinds of phosphor powders, constrain on the choice of exciting light source is lessened.

2. The white light source of the present invention is also formed by mixing light of three primitive colors; the color rendering property is preserved.

3. The present invention employs only two kinds of phosphor powders, cost can be greatly reduced and process can be simplified.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, the method of the present invention includes the step of adding at least two activators (optionally with sensitisor) into host material to form one phosphor, wherein this phosphor is designated to emit light covering two wavelength regimes of the three primitive colors (red, green and blue light) and another phosphor is designated to emit light covering remaining wavelength regime of the three primitive colors. Therefore, all such substitutions and modifications are intended to be embraced within the scope of the invention as defined in the appended claims.

We claim:

1. A method for manufacturing white light source including the steps of:
    providing a light emitting diode emitting ultra-violet radiation; and
    preparing a matter producing white light when exposed to said ultra-violet radiation emitted by said light emitting diode, said matter consisting essentially of two kinds of phosphors,
    one of said two kinds of phosphors including a phosphor chosen from a group of phosphors consisting of $(Y_{2-x}Eu_x)O_2S$ with $0<x\leq0.5$ and $(Y_{2-x}Eu_x)Al_5O_{12}$ with $0<x\leq0.5$.

2. The method as in claim 1, wherein another of said two kinds of phosphors is formed by adding at least two activators and a sensitisor into a host material, said two kinds of phosphors covering full range of a plurality of primitive colors, said another phosphor emitting light covering two wavelength regimes of at least two primitive colors, and said one phosphor of said two kinds of phosphors emitting light covering remaining wavelength regime of said plurality of primitive colors.

3. The method as in claim 2, wherein said another phosphor includes a phosphor chosen from a group of phosphors consisting of $(Ba_{1-x}Eu_x)(Mg_{1-y}Mn_y)Al_{10}O_{17}$ with $0<x\leq0.5$, $0<y\leq0.5$, and $(Ba_{1-x}Eu_x)(Mg_{2-y}Mn_y)Al_{16}O_{27}$ with $0<x\leq0.5$, $0<y\leq0.5$; for emitting blue and green light.

4. The method as in claim 1, wherein said one of said two kinds of phosphors emits red light or orange red light.

5. The method as in claim 1, wherein said phosphor of said two kinds thereof are made by solid-state reaction or chemosynthesis method.

6. The method as in claim 1, wherein said two kinds of phosphors receiving said ultra-violet radiation are mixed in predetermined ratio such that the lights of different wavelength emitting by said two kinds of phosphors are combined to provide a white light.

7. The method as in claim 6, wherein said white light source is packaged in one of the forms including lamp, SMD (surface mount device) and COB (chip on board).

* * * * *